United States Patent [19]

Rabinovich

[11] Patent Number: 5,195,682
[45] Date of Patent: Mar. 23, 1993

[54] METHOD FOR ATTACHING COPPER TO A FERROUS ALLOY

[75] Inventor: Simon M. Rabinovich, Plano, Tex.

[73] Assignee: Honeywell Inc., Minneapolis, Minn.

[21] Appl. No.: 846,649

[22] Filed: Mar. 5, 1992

[51] Int. Cl.⁵ .................. H01R 43/02; H01L 21/60
[52] U.S. Cl. .................. 228/179; 219/56.22; 219/58; 228/4.5
[58] Field of Search ............. 228/4.5, 179; 219/56.1, 219/56.21, 56.22, 58

[56] References Cited

U.S. PATENT DOCUMENTS

| | | | |
|---|---|---|---|
| 2,843,726 | 7/1958 | Kiernan | 219/56.22 |
| 3,514,574 | 5/1970 | Forschler | 219/103 |
| 3,941,298 | 3/1976 | Nicklaus | 228/4.5 X |
| 4,489,231 | 12/1984 | Leutzow | 219/58 |

Primary Examiner—Kenneth J. Ramsey
Attorney, Agent, or Firm—William D. Lanyi

[57] ABSTRACT

A method for welding copper to a ferrous alloy is provided in which an end of the copper wire, either in a single conductor form or a plurality of strands, is exposed to an electrical discharge to form a globule that is generally spherical. The globule is formed by a melting and rapid resolidification of the copper conductor. The generally spherical globule is then placed in contact with a generally flat surface of a ferrous allow terminal. Very slight pressure is provided to avoid deforming the spherical copper globule as a current is passed through both the globule and the ferrous alloy terminal.

3 Claims, 5 Drawing Sheets

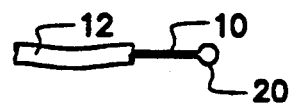
Fig.1A    Fig.1B
Fig.2A    Fig.2B
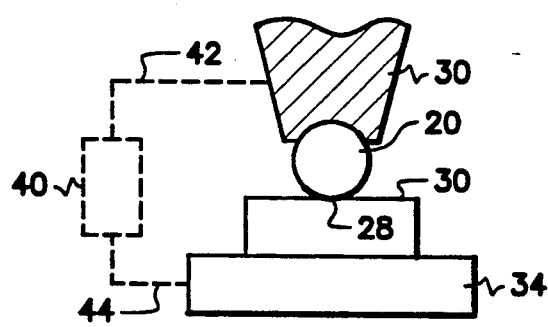
Fig.3

5,195,682

METHOD FOR ATTACHING COPPER TO A FERROUS ALLOY

BACKGROUND OF THE INVENTION

1. Field of the Invention

The present invention is generally related to a method for attaching a first conductor, such as a copper component, to a second conductor, such as a component made of a ferrous alloy, and, more particularly, for welding a stranded copper wire lead to an electrical conductor extending from an electronic device.

2. Description of the Prior Art

Several ways for attaching a conductor, such as a stranded wire lead or a solid wire lead, to a terminal post are well known. One method comprises the steps of stripping a length of insulation from the wire to expose the metal strands, tinning the wire by dipping the metal strands at the stripped end in a suitable flux, immersing the stripped end in molten solder, wrapping the tinned lead around a terminal post to make a secure mechanical connection and applying heat and a flux-core solder to the connection until the joint is completely covered. The joint is then permitted to cool so that the molten solder solidifies. Finally, the joint is cleaned to remove the excess flux by using a solvent solution. Typically the solvent solution is a chlorinated fluorocarbon or a flammable organic.

In certain situations, limited space between the terminals precludes the wrapping of the stranded wire around the terminal to make a secure mechanical connection. In situations when space is not available to wrap the wire around the terminal, a lap joint is sometimes used. Typically the mechanical and electrical suitability of this type of lap joint is very dependent on operator skills and the results can therefore be very unpredictable.

One possible way to overcome the deficiencies of a soldered joint is to use a resistance weld technique. However, as is well known to those skilled in the art, resistance welding of stranded wire to a terminal post is difficult because of the characteristics of the materials involved. For example, the stranded wire is frequently made of tin plated copper. When exposed to high temperatures, the tin plating evaporates and forms blow holes which result in undesirable porosity within the joint. Another serious problem involves the relative thermal and electrical characteristics of copper and ferrous alloys such as Alloy 42 or Kovar. Alloy 42 is 58% iron and 42% nickel while Kovar also comprises 7% cobalt. These alloys differ significantly from that of copper in their physical and electrical properties. More specifically, the relative resistivity of the ferrous alloys, which are typically used for electrical terminals, is higher than that of copper and the thermal conductivity of these ferrous alloys is lower. The ferrous alloy has a higher melting point than copper, but the higher resistance of the alloy causes it to heat in response to an electric current while the copper, because of its low resistivity, does not experience an equivalent temperature rise. Therefore, the ferrous alloy melts and collapses before the copper reaches its melting point. As a result, the high temperature normally used during welding procedures usually melts the ferrous allow with virtually no change to the copper component. Another problem with processes like those described above is that the pressure applied by a welding electrode sometimes unravels the stranded wire during the welding process. This results in some of the strands not being included within the weld joint.

In view of these problems, it would be significantly beneficial if a welding process could be devised to avoid the problems described above and result in a secure joint between copper strands and a lead terminal made of a ferrous alloy.

SUMMARY OF THE INVENTION

The method of the present invention comprises the formation of a solid ball of the wire material at an end of the wire. The nearly spherical globule, or globoid, is then disposed in contact with a generally flat surface of a terminal made of a ferrous alloy. A controlled force is provided to gently press the globule against the surface of the ferrous alloy terminal to assure electrical contact between the conductors, but with care being taken to avoid and significant flattening of the globule. It is important that the contact area between the globule and the flat ferrous alloy be maintained as small as possible. The basic geometric relationship between a sphere and a flat surface results in a minimal contact area between the two conductors which, in turn, results in a very high current density flowing through the globule surface at the point of contact. To minimize the current density at the opposite surface of the globule, or ball, a specially shaped electrode is provided with a generally spherical cavity to increase the contact area between the electrode and the spherical ball and therefore minimize the current density flowing from the electrode into the ball and, therefore, the heating of the upper portion of the globule. Another electrode is disposed in electrical communication with the ferrous alloy terminal to complete the electrical circuit.

Beside achieving a strong mechanical connection between the copper wire and the ferrous alloy, the present invention eliminates the thermal stresses that would otherwise be created through the use of soldering temperatures that could provide a long exposure of high temperature to sensitive devices, such as semiconductor dies, which are usually attached in close proximity to the terminal. Soldering temperatures typically are in excess of 250 degrees centigrade and the soldering procedure sometimes exceeds 5 seconds. The present invention also eliminates the health hazards which are associated with lead-bearing material in the work area. Another benefit of the present invention is the elimination of flammable or ozone-depleting solvents from the factory environment.

BRIEF DESCRIPTION OF THE DRAWINGS

The present invention will be more fully understood from a reading of the Description of the Preferred Embodiment in conjunction with the drawing, in which:

FIG. 1A shows a typical single element conductor;

FIG. 1B shows the conductor of FIG. 1A after a spherical ball is formed at its end;

FIG. 2A shows a multiple strand conductor;

FIG. 2B shows the multiple strand conductor of FIG. 2A after a ball is formed at its end;

FIG. 3 shows schematic representation of a welding process within the scope of the present invention;

DESCRIPTION OF THE PREFERRED EMBODIMENT

Figure 4:
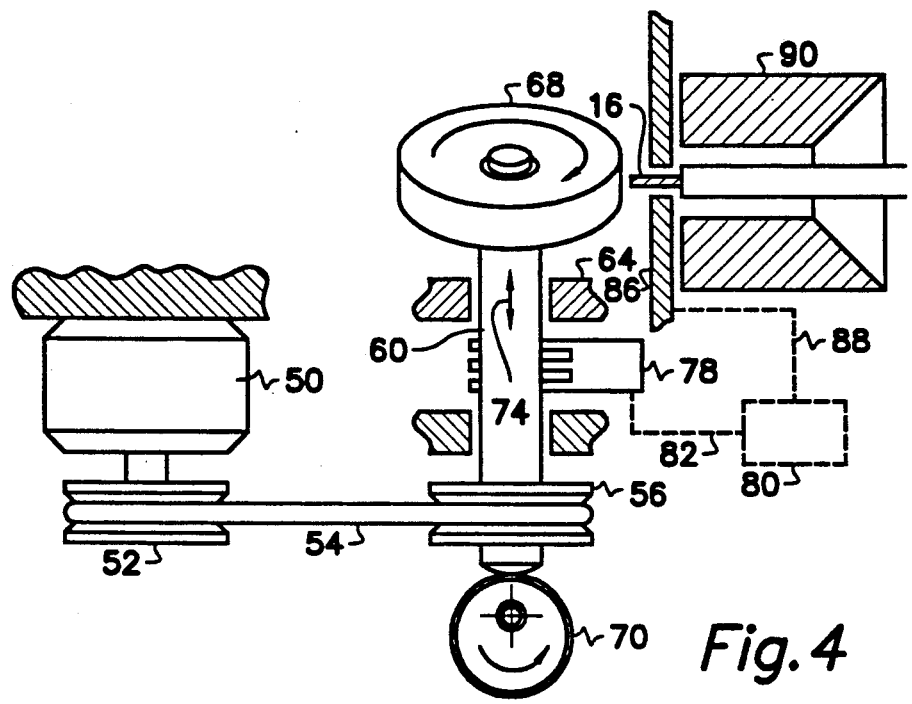
FIG. 4 shows a device used to perform the ball forming operation of the present invention.

Throughout the Description of the Preferred Embodiment, like components will be identified by like reference numerals.

FIG. 1A illustrates a typical single wire conductor which comprises an electrically conductive metal wire 10 that is enclosed within an insulative sheath 12. FIG. 2A shows a typical stranded conductor 16 that comprises a plurality of thin wires which are enclosed within a insulative sheath 12. The conductors, 10 and 16, shown in FIGS. 1A and 2A are typically made of copper and are occasionally tin plated with a material which sometimes includes silver.

One step of the method of the present invention comprises the formation of a nearly spherical globule, or globoid, at one end of the conductor. For example, globule 20 is shown in FIG. 1B at an end of the conductor 10. A similar globule 20 is shown in FIG. 2B formed at the end of the plurality of strands. It should be understood that virtually all of the strands shown in FIG. 2B terminate in the globule 20. The globule 20, shown in FIGS. 1B and 2B, is formed by melting the end of the conductor, either 10 or 16, and then resolidifying the molten metal. In a preferred embodiment of the present invention this operation is performed in an apparatus which creates a controlled electrical discharge between the end of wire and a graphite electrode. During this rapid operation, the strands melt and, as a result of the surface tension of the molten wire material, the wire quickly resolidifies in a nearly spherical globule into which each strand of the wire is terminated. An apparatus for performing the melting and resolidifying procedure will be described in greater detail below.

FIG. 3 shows a highly schematic representation of a welding device for the purpose of illustrating the primary advantage of the present invention. The globule 20 is shown being disposed in contact with a terminal 26 that is made of a ferrous material. It should be noted that these two components are in contact with each other at an extremely small contact location 28 which is the geometric result of the spherical shape of the globule 20 and the flat surface 30 of the ferrous alloy terminal 26. An upper electrode 30 and a lower electrode 34 are used to provide an electrical circuit through which current is passed during the welding procedure. A power supply 40 is shown in dashed line representation in FIG. 3 to illustrate the path of current which passes through the power supply 40, conductors 42 and 44, the upper and lower electrodes 30 and 34, and the copper and ferrous components, 20 and 26, respectively. The apparatus shown in FIG. 3 will be described in more detail below.

It is important to understand that the welding process described above in conjunction with FIG. 3 is made possible because of the method of the present invention for forming the globule 20 at an end of a first conductor, such as the single wire 10 or the stranded conductor 16 shown in FIGS. 1A and 2A. The formation of the globule 20 at an end of the first conductor allows the first and second conductors to be placed in contact with each other while maintaining a very small contact area between the two conductors which, in turn, contributes to the rapid and effective melting of the copper conductor more quickly than would otherwise be possible if a larger surface area of the first conductor is placed in contact with the second conductor.

FIG. 4 shows an exemplary illustration of one particular apparatus that has been developed for use in practicing the method of the present invention. It should clearly be understood that the device shown in FIG. 4 is only one of several techniques that can be used to practice the present invention. As shown in FIG. 4, a low speed motor 50 is used to rotate a pulley 52 which, in turn, drives a belt 54 to rotate a second pulley 56 that is attached to a shaft 60. The shaft is supported by bearings 62 and 64 to rotate a graphite wheel 68. It should be understood that the speed of rotation of the graphite wheel 68 is very slow and is performed for the purpose of presenting new portions of the graphite wheel 68 to successive presentations of the wire 16 during subsequent procedures. An eccentric 70 rotates to cause the shaft 60 to move up and down as indicated by arrow 74. The oscillations of the graphite wheel 68, caused by the eccentric 70, are provided to further distribute the contact points between the wire 16 and the graphite wheel 68 over a larger surface area of the wheel to avoid degrading a specific portion of the wheel 68 through repeated use of a limited area. A current brush 78 is used to maintain electrical contact with the shaft 60. The brush 78 is connected to a power supply 80. Beside being connected in electrical communication with the brush 78, by line 82, the power supply 80 is also connected in electrical communication with a clamping plate 86 by line 88. In a typical application of the present invention, the power supply 80 is configured to provide a 24 volt potential between the plate 86 and the graphite wheel 68. As will be described in greater detail below, the clamping plate 86 performs a dual function. First, when activated, the clamping plate 86 seizes the first conductor 16 and holds it in place. Secondly, the clamping plate 86 provides electrical communication between the power supply 80 and the first conductor.

Although not illustrated in detail in FIG. 4, it should be understood that the components relating to the motor 50, the shaft 60, the eccentric 70, the bearings 62 and 64, the belt 54 and the graphite wheel 68 are all supported on a common structure which is moveable relative to the clamping plate 86. A wire guide 90 provides a locating reference through which the wire can be passed. When the end of the stranded wire contacts the surface of the rotating graphite wheel 68, the force of the end of the wire against the graphite wheel 68 causes the graphite wheel, its shaft 60 and the other components on the common moveable structure to move toward the left in FIG. 4 away from the clamping plate 86. In a preferred embodiment of the present invention, the moveable component shown in FIG. 4 are urged toward the right by a spring whose resistance is overcome by the force of the stranded wire 16 against the graphite wheel 68. When the moveable structure moves toward the left in FIG. 4 by a predetermined amount, it causes a switch to be actuated to complete the electrical circuit which includes the power supply 80, the clamping plate 86, the brush 78, the shaft 60, the graphite wheel 68 and the stranded conductor 16. As will be described in greater detail below, the mechanism is configured to discharge an electrical current between the graphite wheel 68 and the plate 86. This discharge melts the end of the strands 16. This is followed by a rapid resolidification of the molten strands into a generally spherical globule, as described above in conjunction with FIGS. 1B, 2B and 3. The apparatus shown in FIG. 4 provides one technique to form the spherical ball. However, as is well known to those skilled in the art, many alternative processes are known for the purpose of melting metal. Other processes are therefore available to create the ball at the end of the conductor, whether the conductor is a plurality of stands 16 or a single conductor 10 as shown in FIGS. 2A and 1A, respectively.

Figure 5:
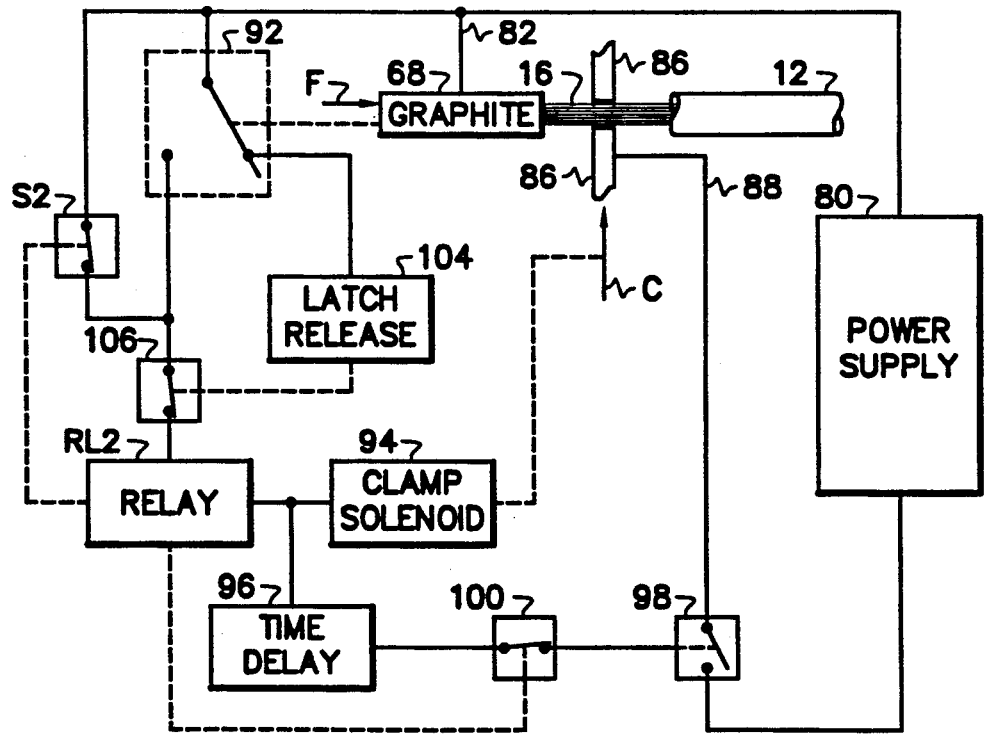
FIG. 5 is a schematic block diagram of a power and control circuit need to perform the operation of the present invention.

FIG. 5 is a schematic representation of an apparatus which performs the necessary operations to melt the end of the stranded wire 16 and permit its rapid resolidification according to the method of the present invention. When the end of the stranded wire 16 is pushed against the graphite wheel 68, it exerts a force against the wheel which overcomes a spring force F provided by a spring or other suitable resilient member. As the end of the stranded wire 16 continues to push the graphite wheel 68 toward the left in FIG. 5, a switch 92 is caused to move from its normal position shown in FIG. 5 in a direction toward the left. When that switch 92 is actuated, it provides power to a relay RL2 which performs several functions. Relay RL2 latches itself to the power supply 80 by closing switch S2. In addition, relay RL2 actuates the clamp solenoid 94 that causes the clamping plate 86 to cease the stranded wire 16 as illustrated. This seizure of the stranded wire 16 prevents any further movement of the conductor and also provides electrical communication between the clamping plate 86 and the strands of the stranded conductor 16. The relay RL2 also operates through a time delay circuit 96 to actuate a switch 98 that, in a preferred embodiment of the present invention, is a field effect transistor. In one particular embodiment of the present invention, a second switch 100 is operated by relay RL2 and that switch is placed in series with the connection provided by the time delay circuit 96.

When switch 98 is closed, a current is permitted to flow from a storage capacitor through the circuit defined by the switch 98, the power supply 80, the graphite wheel 68, the stranded wire 16 and the clamping plate 86. As will be discussed below, it has been discovered that superior results are obtained if the current is caused to flow in a direction from the graphite wheel 68 through the stranded wire 16 toward the clamping plate 86 (i.e. the graphite wheel is connected to the negative terminal of the power supply and the clamping plate is connected to the positive terminal of the power supply). While an opposite flowing current can also melt the wire, the shape of the globule resulting from the operation has been inferior during testing of the present invention.

The time delay circuit 96 permits the clamping plate 86 to move, as represented by arrow C, and firmly clamp the stranded wire 16 before current is caused to flow from a storage capacitor through the graphite wheel 68, the stranded wire 16 and the clamping plate 86.

When the graphite wheel 68 returns to its original position in response to the force of its spring, switch 92 returns to its normal position and actuates the latch release 104 which opens switch 106 to unlatch the relay RL2. It should be understood that the schematic illustration shown in FIG. 5 is representative of one embodiment of the present invention and does not limit its scope to any particular electrical circuit or apparatus configuration.

Figure 6:
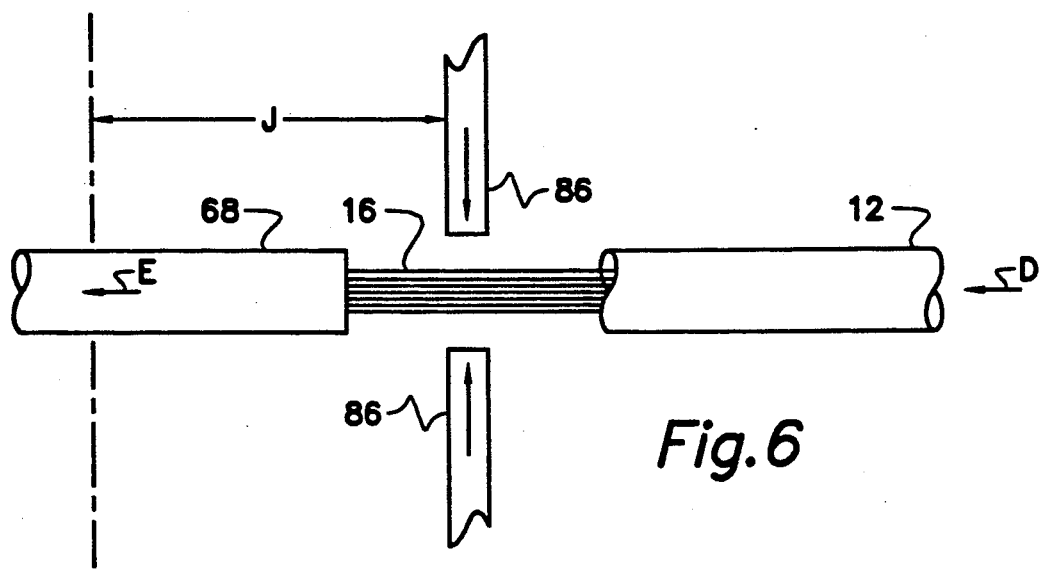
FIG. 6 shows the relative arrangement of the wire, clamping plate and graphite electrode of the present invention.

FIG. 6 shows a detailed representation of a portion of FIG. 5 that includes the graphite wheel 68, the stranded wire 16 and the clamping plate 86. Reference numeral 108 represents the central axis of rotation of the graphite wheel 68. When the end of the stranded wire 16 pushes against the graphite wheel 68, in a direction represented by arrow D, the graphite wheel is moved toward the left in FIG. 6 in the direction represented by arrow E. Because the graphite wheel is arranged on a moveable component, the distance identified by reference letter J in FIG. 6 increases until the graphite wheel 68 causes switch 92 to be actuated as described above in conjunction with FIG. 5.

Figure 7A:
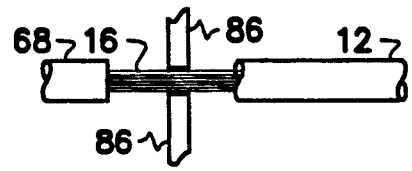
FIGS. 7A-7D show successive steps of the globule forming process.
Figure 7B:
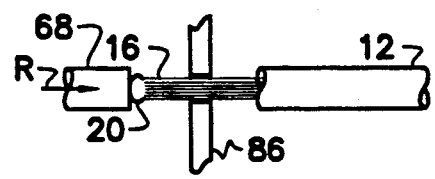
Figure 7C:
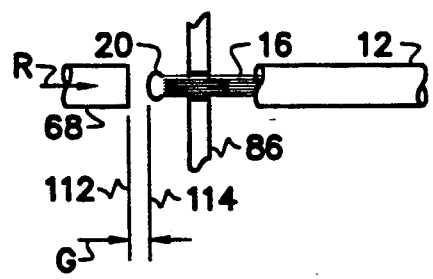
Figure 7D:
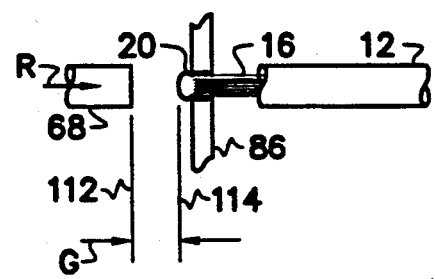

FIGS. 7A-7D illustrate sequential steps that occur during the operation of the present invention. The first event, which is illustrated in FIG. 7A, is when the clamping plate 86 seizes the stranded wire 16 in response to the actuation of switch 92 shown in FIG. 5. As can be seen in FIG. 7A, the end of the stranded wire 16 is in contact with a surface of the graphite wheel 68. When a current is caused to flow through the graphite wheel 68, the stranded wire 16 and the clamping plate 86, the end of the stranded wire 16 begins to melt. This event is shown in FIG. 7B. As the stranded wire 16 melts, a globule 20 begins to form the rigid length of the conductor 16 decreases and the graphite wheel 68 is permitted to return in the direction identified by reference letter R toward the clamping plate 86 in response to the spring force described above.

As the end of the stranded wire 16 continues to melt and the graphite wheel 68 continues to move in the direction identified by reference letter R, the wheel eventually stops when it reaches its original position prior to the movement caused by the stranded wire 16. When its movement stops, the contact surface of the graphite wheel 68 is located at line 112 and the nearest portion of the globule 20 is at line 114 to define a gap G between the globule 20 and the graphite wheel 68. If gap G is sufficiently small, an electrical arc can bridge gap G and continue to maintain the molten state of the globule 20. As the arc bridges gap G, the size of globule 20 continues to grow. Eventually, the distance between the graphite wheel 68 and the globule 20 achieves a dimension G which is sufficient to extinguish the arc and permit the molten metal of the globule 20 to resolidify. The clamping plate 86 can then be opened to release the stranded wire 16 and permit the removal of the stranded wire 16 and its globule 20.

Figure 8:
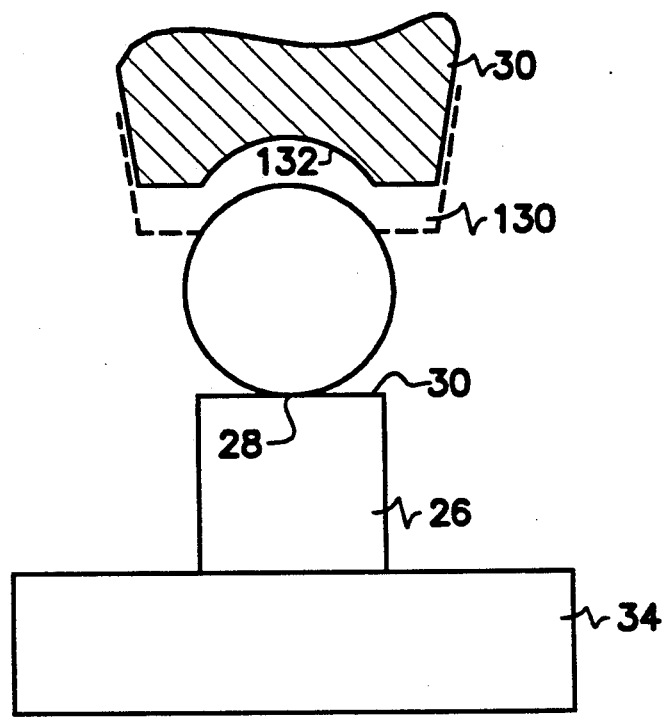
FIG. 8 shows a welding apparatus in a schematic illustration.

FIG. 8 shows a representation of the generally spherical globule 20, the ferrous alloy terminal 26, the upper electrode 30 and the lower electrode 34. In FIG. 8, the upper electrode is shown in its two operative positions, the upper position 30 and the lower position 130 which is represented by dashed lines. It is important to note that a generally spherical depression 132 is provided in the upper electrode 30. The generally spherical depression 132, or cavity, is provided to increase the area of contact between the electrode 30 and the globule 20. The purpose of this surface contact maximization is to minimize the current density contact surface between the electrode 30 and the upper portion of the globule 20.

This increase of contact area reduces the possibility that the copper globule 20 will melt at its upper regions.

Because of the geometric relationship between the spherical globule 20 and the generally flat surface 30 of the ferrous conductor 26, a point contact 28 results. The point contact 28 between the globule 20 and the flat surface 30 increases the current density at that point of common contact. It is realized that, in reality, the theoretical point contact 28 shown in FIG. 8 is actually slightly larger than a single point of contact because of the slight deformity of the globule 20 that occurs during the welding operation and, in addition, because of the possible imperfection in the shape of the globule 20 which is not precisely a sphere in every case. As discussed above, copper has a much higher conductivity than the ferrous alloys. The maximized current density at contact point 28 assists in melting the copper 20 more rapidly before the entire ferrous alloy terminal 26 is consumed by the elevated temperature which occurs during the welding process. It is very important that the downward force of electrode 30 not be sufficient to significantly deform the globule 20 and increase the surface are of contact between the globule 20 and the surface 30. If the surface area at the contact between the globule 20 and surface 30 is increased significantly beyond a point contact, the current density flowing through that portion of the globule 20 will not be sufficient to initiate the melting of the first conductor and will permit the second conductor, or ferrous alloy, to completely melt before the first conductor begins to melt. By increasing the temperature of the copper proximate the contact point 28, as a result of the maximized current density at that location, the copper is melted as the ferrous alloy melts and a strong bond of alloy material is produced.

Figure 9:
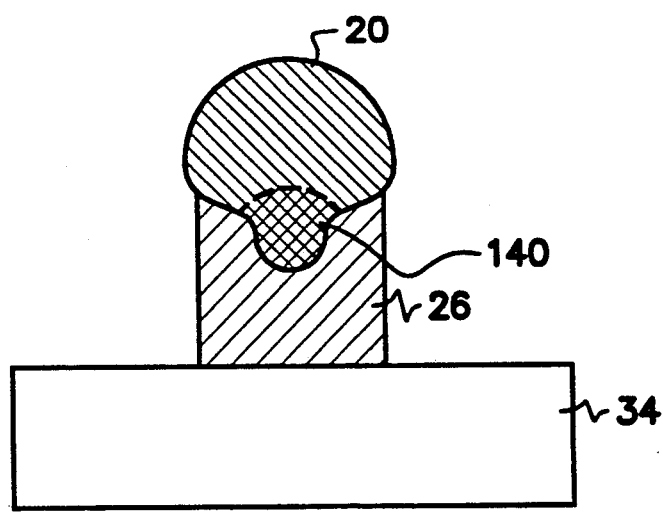
FIG. 9 shows an exemplary weld achieved by the present invention.

FIG. 9 shows an exemplary representation of a cross sectional area of the copper and ferrous alloy conductors after the welding process is complete. As can be seen, the globule 20 of the first conductor is deformed at its lower regions and the ferrous alloy terminal 26 of the second conductor is melted in a region extending from its upper surface 30 into its middle regions. The double cross hatching in FIG. 9 represents the area within which the copper and ferrous materials have melted and resolidified as an alloy. That region is identified by reference numeral 140. Test welds of the type shown in FIG. 9 have been dissected to reveal that the portion of the weld identified by reference numeral 140 is magnetic. This signifies that a portion of the ferrous material is alloyed with the copper material.

Figure 10:
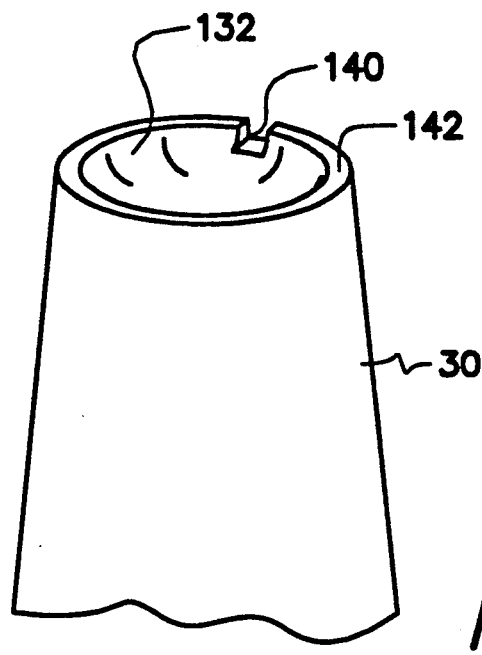
FIG. 10 shows a specific electrode shape.
Figure 11:
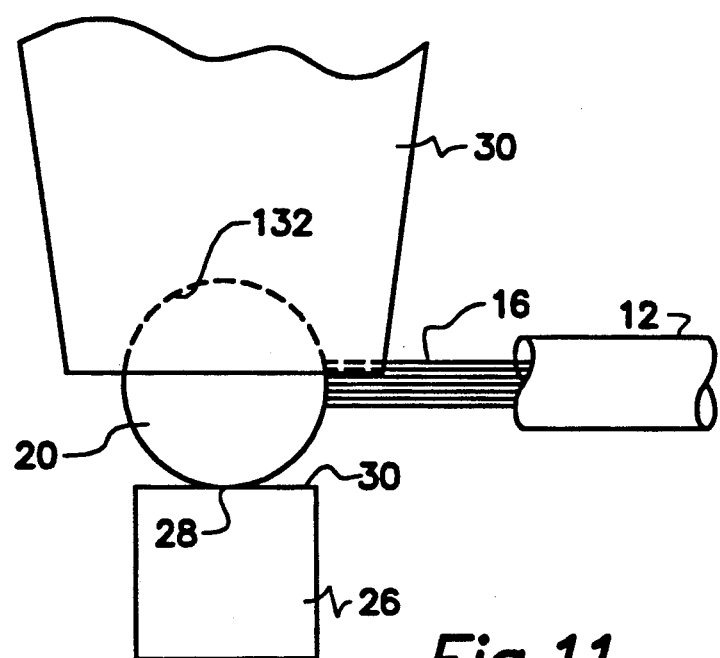
FIG. 11 shows the electrode of FIG. 10 in use.

FIG. 10 shows an end portion of the electrode 30. As can be seen, the end of the electrode is shaped to form a concave and generally spherical depression 132. In a preferred embodiment of the present invention, a portion of the rim 142 is shaped to permit the stranded conductor 16 to extend through the rim 142 when the globule 20 at its end is disposed in the depression 132. This association is shown in FIG. 11. The upper surface of the globule 20 is disposed in contact with the increased surface are provided by the depression 132 so that current flowing between the electrode 30 and the globule 20 will have a reduced current density in the upper region of the globule. In contrast, the geometric relationship between the globule 20 and the flat surface 30 of the second conductor 26 results in a very small contact area between them to maximize the current density in the bottom region of the globule 20 and induce its rapid melting in the manner described above.

It has been determined that the process of the present invention results in significant improvement in both the mechanical strength of the weld and the electrical conductivity between the copper conductor and the ferrous alloy terminal. Although many variations of the present invention are possible within its scope, certain advantageous steps have been identified. For example, the formation of the globule 20 by the melting and resolidification process has been found to be most satisfactorily formed if a current is caused to flow in a direction from the graphite wheel 68, through the stranded wire 16 to the clamping plate 86. Although a current flowing in the opposite direction will cause the stranded wire to melt, the shape and size of the globule may be inferior. In addition, when the conductor of the wire, such as the single conductor 10 or the multiple strands 16, are copper, a molybdenum electrode 30 has been found to be particularly effective. Similarly, when Kovar or alloy 42 terminals are used, a copper-chromium electrode 34 has been found to be effective. However, it should be understood that many different materials can also be used within the scope of the present invention and various other operational parameters can be used during the globule forming and welding procedures. The important characteristic of the present invention is the formation of the generally spherical globule 20 at the end of the copper conductor, whether it is a single conductor 10 or multiple strands 16. This globule 20 provides the minimized contact 28 with the ferrous conductor which, in turn, provides the maximized current density to melt the copper conductor in coordination with the melting of the ferrous alloy terminal 26.

Although the present invention has been described with considerable detail and illustrated with significant specificity, it should be understood that alternative embodiments of the present invention are also possible and should be considered within its scope.

The embodiments of the invention in which an exclusive property or right is claimed are defined as follows:

1. A method for preparing a first conductor for attachment to a second conductor, comprising:
   melting an end of said first conductor by passing an electric current through said first conductor between a graphite electrode and another electrode, said graphite electrode being disposed proximate said end of said first conductor, said electric current flowing in a direction from said graphite electrode toward said first conductor, said graphite electrode being rotatable; and
   permitting said end of said first conductor to resolidify following said melting step.

2. A method for preparing a first conductor for attachment to a second conductor, comprising:
   suspending said first conductor between two electrically conductive members;
   causing an end of said first conductor to move into contact with a first one of said conductive members, said first one of said conductive members being a rotatable graphite electrode;
   moving said first one of said conductive members against a spring force;
   discharging an electric current between said two electrically conductive members and through said first conductor in a direction from said graphite electrode toward said first conductor;
   melting said end of said first conductor; and
   allowing said end of said first conductor to solidify.

3. A method for preparing a first conductor for attachment to a second conductor, comprising:
   melting a distal end of said first conductor by attaching a first conductive member to said first conductor at a preselected distance from said distal end, disposing a second conductive member in contact with said distal end and passing an electric current between said first and second conductive members through said first conductor in a direction from said second conductive member toward said distal end, said second conductive member being a rotatable graphite electrode; and
   causing said distal end to resolidify as a globule which is generally spherical.

* * * * *